United States Patent [19]
Son

[11] Patent Number: 5,850,345
[45] Date of Patent: Dec. 15, 1998

[54] SYNCHRONOUS DISTRIBUTED SIMULATION APPARATUS AND METHOD

[75] Inventor: Chan Soo Son, Nakai-machi, Japan

[73] Assignee: Fuji Xerox Co., Ltd., Tokyo, Japan

[21] Appl. No.: 733,595

[22] Filed: Oct. 18, 1996

[30] Foreign Application Priority Data

Jan. 29, 1996 [JP] Japan .................................. 8-034295

[51] Int. Cl.$^6$ .................................................. G06F 9/455
[52] U.S. Cl. ............................................ 364/578; 395/500
[58] Field of Search .................................. 395/500, 685; 364/578

[56] References Cited

U.S. PATENT DOCUMENTS

| | | | |
|---|---|---|---|
| 4,901,260 | 2/1990 | Lubachevsky | 364/578 |
| 4,965,743 | 10/1990 | Malin et al. | 364/578 |
| 5,247,650 | 9/1993 | Judd et al. | 395/500 |
| 5,375,074 | 12/1994 | Greenberg et al. | 364/578 |
| 5,625,823 | 4/1997 | Debenedictis et al. | 395/685 |
| 5,652,871 | 7/1997 | Steinman et al. | 395/500 |
| 5,701,439 | 12/1997 | James et al. | 395/500 |

FOREIGN PATENT DOCUMENTS

| | | |
|---|---|---|
| A-3-261320 | 11/1991 | Japan . |
| A-3-261329 | 11/1991 | Japan . |
| A-5-89081 | 4/1993 | Japan . |

OTHER PUBLICATIONS

ORSJ Pub. Series T–94–1, New Directions in simulation for manufacturing and communications; 1994, "A Basic study on a distributed simulation for virtual manufacturing", FUJI et al. Kobe Univ., pp. 277–281.

Proceedings of the 1994 Winter Simulation Conf, "Using a shot clock to design an efficient parallel distributed simulation", John T. Douglass et al., Dept. Of Computer Science, Clemson Univ.. pp. 1362–1369.

*Primary Examiner*—Vincent N. Trans
*Assistant Examiner*—Tyrone V. Walker
*Attorney, Agent, or Firm*—Oliff & Berridge, PLC

[57] ABSTRACT

The present invention provides a synchronous distributed simulation apparatus having a simulation supervising device which supervises a simulation device, and the simulation device which performs a synchronous simulation under supervision of the simulation supervising device, in which the simulation supervising device comprises counting means for counting time in simulation, time width setting means for setting a time width of simulation for each time zone where facilities are operated in a manufacturing process which is an object of the simulation in accordance with the time counted by the counting means, and transmitting means for transmitting data showing the time width set by the time width setting means to the simulation device, and the simulation device comprises receiving means for receiving the data showing the time width transmitted by the transmitting means in the simulation supervising device, discrete-event simulation means for simulating the manufacturing process in which change of a state may be modeled to discretely occur, and controlling means for performing simulation by the discrete-event simulation means with the time width of simulation according to the data showing the time width received by the receiving means.

17 Claims, 8 Drawing Sheets

|  | SIMULATION TIME | VALUE OF Δt |
|---|---|---|
|  | 0TH ROW | 1ST ROW |
| 0TH LINE | 2850 | 30 |
| 1ST LINE | 1950 | 180 |
| 2ND LINE | 1920 | 30 |
| 3RD LINE | 1725 | 5 |
| 4TH LINE | 1680 | 45 |
| 5TH LINE | 1440 | 5 |
| 6TH LINE | 1410 | 30 |
| 7TH LINE | 510 | 180 |
| 8TH LINE | 480 | 30 |
| 9TH LINE | 285 | 5 |
| 10TH LINE | 240 | 45 |

| NAME | FUNCTION | ARGUMENTS |
|---|---|---|
| INIT | INITIALIZE | Δt. period |
| INOK | INITIALIZE COMPLETE | 0 or 1. |
| TRIQ | TRANSPORT IN REQUEST | jobID. stationNo.. numOfitems. itemName. quantity |. itemName. quantity |
| TROQ | TRANSPORT OUT REQUEST | jobID. stationNo.. numOfitems. itemName. quantity |. itemName. quantity |
| TROE | TRANSPORT COMPLETE | originaljobID. stationNo. |
| STKQ | STOCK REPORT REQUEST | |
| STKA | STOCK REPORT ANSWER | numOfitems. itemName. quantity |. itemName. quantity |
| PROD | PRODUCT DIRECTIONS | numOfitems. itemName. quantity |. itemName. quantity |
| INPT | INPUT TO STORAGE | numOfitems. itemName. quantity |. itemName. quantity |
| OUPT | OUTPUT FROM STORAGE | numOfitems. itemName. quantity |. itemName. quantity |

\* ORIGINAL JOB ID IS A JOB ID FOR TRANSPORT
  IN REQUEST OR TRANSPORT OUT REQUEST

FIG.4

SYNCHRONOUS DISTRIBUTED SIMULATION APPARATUS AND METHOD

BACKGROUND OF THE INVENTION

1. Field of the Invention

The present invention relates to a synchronous distributed simulation method for a manufacturing system which performs a discrete-event simulation by combination of plural simulation devices, and in particular relates to a distributed simulation apparatus and a distributed simulation method for conducting a simulation with changing the interval of synchronization per every operating time zone of the production line.

2. Discussion of the Related Art

Conventionally, as disclosed by Japanese Patent Application Laid-Open No. Hei. 5-89018 (1993), a distributed simulation method of centralized supervising synchronous type has been known, in which plural discrete-event simulation devices (also referred to as simulators) and a simulation supervising device supervising thereof (also referred to as a supervisor) are connected to a network, and each simulator conducts simulation of a predetermined time width in accordance with the synchronization command from the supervisor.

An idea of the discrete events is a modeling of the case where only the state transition of an object should be taken into consideration. For example, if a product is ultimately finished after processes of assembling a lot of parts on a frame, painting, and so forth, these processes can be considered as the discrete events from a viewpoint that the state is changed by the events such as assembling parts, painting and so forth. Consequently, even continuous events expressed by a differential equation can be treated as the discrete events by extraction of only the change of the state.

In the conventional centralized supervising synchronous type simulation method, a time bucket method is proposed as follows: each simulator performs simulation of a predetermined time width $\Delta t$ in accordance with every command of execution of simulation from a supervisor, and after the simulation of the time width $\Delta t$ is completed, each simulator proceeds its simulation clock by $\Delta t$ and returns a sign of simulation completion to the supervisor. The series of simulations is advanced by repeating these operations. (See "A basic study on a distributed simulation for virtual manufacturing", S. Fujii et al., ORSJ Publication Series T-94-1, Operations Research Society of Japan, 1994, pp. 277–281)

The simulation according to this method is shown in FIG. 5. Assuming that two simulators A and B are supervised by a single supervisor, data A1 and B1 are transmitted to the supervisor from the simulator A and simulator B, respectively, before the first simulation of the time width $\Delta t$ is started. At the time of starting the simulation $T_1$, the data A1 is transmitted to the simulator B and the data B1 is transmitted to the simulator A. When the simulation of the time width $\Delta t$ is completed in each of the simulators A and B, the simulators A and B return data A2 and B2, respectively, to the supervisor, which contain the sign of simulation completion. At this time, the clocks of the supervisor and each simulator have been set to $T_2$ where $T_2 = T_1 + \Delta t$. In the same way, at the time of starting the next simulation $T_2$, the data A2 is transmitted to the simulator B and the data B2 is transmitted to the simulator A, and then the simulation of the time width $\Delta t$ is executed in each of the simulators A and B. When the simulation is completed, the simulators A and B proceed their simulation clocks by $\Delta t$ and transmit data A3 and B3 containing the sign of simulation completion to the supervisor, respectively. Thus execution of simulation of the time width $\Delta t$ is repeated while the data are exchanged as described above until the whole simulation is completed within a predetermined simulation time.

The processes executed by such simulators and supervisor is performed as shown in FIGS. 6 and 7. The process of the simulator is achieved by embedding two types of routines "SOURCE" and "SINK" in a simulation model and processing these routines in accordance with the synchronization signal in the supervisor. "SOURCE" receives the command of starting the simulation of the time width $\Delta t$ and the data transmitted by another simulator from the supervisor. "SINK" stores data to be transmitted to another simulator during the simulation process, if any, and after the simulation of the time width $\Delta t$ is completed, transmits it to the supervisor with the sign of simulation completion.

That is, as shown in FIG. 6, after the simulation time width $\Delta t$, starting time $T_o$ and completing time $T_e$ are set (step 1), the simulator sets a time variable T to the starting time $T_o$ (step 2). It is then examined whether the time variable T has exceeded the completing time $T_e$ or not (step 3), and if the time variable T does not exceed the completing time $T_e$, the following processes, in each of which the simulation is of the time width $\Delta t$, are repeated until the time variable T exceeds the completing time $T_e$: the process of "SOURCE" is executed (step 4), simulation is performed in accordance with a predetermined description of the process (step 5), data is transmitted to the supervisor by the "SINK" process (step 6), and the next simulation is performed by increasing the value of the time variable T by the time width $\Delta t$ (step 7).

The process is described by the simulation language which is called, for example, "SLAM".

When the command to start the simulation of the time width $\Delta t$ is transmitted, the supervisor adds data forwarded from each simulator to the command and transmits them to each simulator, and receives data transmitted by each simulator at the time of receiving the sign of simulation completion from each simulator. In other words, as shown in FIG. 7, if the simulation time width $\Delta t$, starting time $T_o$ and completing time $T_e$ are set (step 11), the supervisor sets the time variable T to the starting time $T_o$ (step 12), and repeats the following processes each of which is of the time width $\Delta t$ until the time variable T exceeds the completing time $T_e$ (step 13): the supervisor transmits the command of starting the simulation of the time width $\Delta t$ to all simulators (step 14), receives the signs of simulation completion from simulators in order (step 15), increases the value of the time variable T by the time width $\Delta t$ when the signs of simulation completion from all simulators are received (steps 16 and 17), and divides the data received with the completion signs into groups of different destinations to add them to the commands of starting simulation of the next time width $\Delta t$ (step 18). Consequently, the data collected from the simulators are divided into groups of different destinations, and transmitted to another simulator with the command of starting the next simulation.

A synchronous distributed simulation apparatus having the construction as shown in FIG. 8 is proposed to execute the distributed simulation using different types of simulators. The mechanism of execution of simulation by the distributed simulation apparatus is almost the same as that of the above-described method except that a supervisor 1 is constructed so that the information exchange may be possible through the network by the data standardized between the different types of simulators 20A and 20B.

The supervisor 1 comprises a simulation controller 4 to which display means 2 and inputting means 3 are connected, a data processor 5, a communication processor 6 and communication ports 7. The simulation controller 4 further comprises a simulation time counter 8, a simulation time determination component 9, a simulation period holding component 10 and a Δt value holding component 11.

Each of the simulators 20A and 20B comprises a simulator main body 23 having display means 21 and inputting means 22, in which a simulation model is described, a data conversion mechanism 24, a communication processor 25 and a communication port 26. The simulators 20A and 20B have the same constructions though the contents of simulation are different.

In such distributed simulation apparatus, the simulation time width Δt and the simulation period are stored in the Δt value holding component 11 and the simulation period holding component 10, respectively, by the inputting means 3 of the supervisor 1. The data exchange among the supervisor 1, the simulators 20A and 20B during the execution of simulation is carried out as follows:

First, the data necessary for execution of simulation is described with a structure as shown in FIG. 9. A CTL message located at the top of the figure is a command for controlling the simulation, and hereinafter referred to as a message. Subsequent to the CTL message, the number of SIM messages which indicates that how many SIM messages exist as the arguments of the CTL message is described by an unsigned binary. Next, groups of data enabling easy fetching of each SIM message and its argument, such as a byte-unit position of the SIM message from the starting point, byte sizes of the SIM message and its argument, are described to the number of the SIM messages, and moreover, in the portion of a series of simulation data subsequent thereto, the entities of the SIM messages are located in the order provided by the above descriptions.

Consequently, for example, in the case where the value of the position of SIM message 1 is 24 and the size of the SIM message 1 is 40 in FIG. 9, the whole SIM message 1 can be fetched by setting the pointer to 24th position from the starting position and reading data of 40 bytes therefrom.

The messages transmitted from the supervisor 1 to the simulator 20A and 20B are: a simulation preparation message for notifying the value of simulation time width Δt and the simulation period to each simulator to make the simulator prepare the simulation, a Δt simulation execution message which provides a direction for execution of simulation of the time width Δt, a simulation completion message and so forth, which are represented as SIMS, DTST, HREQ and so forth, respectively, by 4-byte ASCII characters.

These messages are generated under the supervision of the simulation controller 4, the data to be added to the messages are collected by the data processor 5, and collected data are transmitted to the communication processor 25 of the destination simulator through the communication port 7, the network 15 and the communication port 26.

As the simulators 20A and 20B receive these data (messages), the data conversion mechanism 24 interprets the data and converts them into the simulation data.

Simulation controlling messages transmitted from each of the simulators 20A and 20B to the supervisor are: SIMR indicating that the preparation of simulation is completed, DTEN indicating that simulation of time width Δt is completed, SEND indicating that completion of simulation is accepted, and so forth. If simulation in each of the simulators 20A and 20B is completed, the data conversion mechanism 24 collects data to be transmitted to the other simulator, adds CTL message to the data, and transmits them to the supervisor 1 through the communication processor 25.

In this method, the data transmitted/received between the simulators 20A and 20B is provided as a series of frames having the SIM message, issuer of the message, destination, a name of a destination buffer, a name of a variable (a name of an article), the number of variables (articles) to be transmitted, 6, as the argument.

There are several types of SIM messages such as a request for transportation of articles, a request for carrying out articles, confirmation of storage of articles, and a command of manufacturing articles, which are represented by 4-byte ASCII characters as same as the CTL messages described above, such as "TROQ", "TRIQ", "STKQ" and "PROD", respectively. For example, in the case where articles AAAA to the number of 10 are transferred from the simulator 20A (SIM20A) to the part storage (PT01) of the simulator 20B (SIM20B), data is described as follows: "TROQSIM20BSIM20APT01AAAA'10'"

'10' in the last position indicates that it is represented by the unsigned binary.

The simulation is executed as follows. The supervisor 1 transmits the CTL messages "SIMS" to the simulators 20A and 20B to make them prepare to start the simulation, and waits for "SIMR" indicating that the preparation of simulation is completed to be returned by each simulator. On receiving "SIMR"s from all simulators, the supervisor 1 transmits "DTST"s to all simulators. If a request for transporting articles to another simulator or delivery of articles from another simulator is made by each simulator, the request is returned to the supervisor 1 as the SIM message, namely, as the argument of the CTL message "DTEN" when the simulation of the time width Δt is completed. On receiving this frame from each simulator, the supervisor 1 updates the simulation time by adding the value set in the Δt holding component 11 to the value of the simulation time counter 8 while dividing all SIM messages into groups of different destinations, and transmits next CTL message "DTST" to each simulator with the re-grouped SIM messages as the argument. That is, the simulation of the time width Δt is repeated until the simulation time reaches the value set at the simulation period holding component 10 with the sequence as shown in FIG. 5.

In the conventional synchronous distributed simulation apparatus described above, the simulation time width Δt is set to a certain value in advance, and in many cases, the predetermined value is set to the tact time of modeled line. The tact time means the time taken for manufacturing the next article after an article has been manufactured in an assembly line manufacturing, which can be calculated based on the operation time and the amount of manufacturing in a day. In a manufacturing line having a single line, for example, if the amount of finished products is 500 and the operation time is 480 minutes in a day, the tact time of the line is 0.96, the result of division of 480 by 500. In the case where there are plural lines and each line has a different tact time, it is possible in some situations to select the shortest tact time to use it as the value of the time width Δt. In the case where the processes over the plural simulators frequently occur, the shortest one of the operation times of the plural processes, not the tact time, may be employed as the time width Δt.

Some manufacturing plants have lines which require frequent supply of parts such as assembly lines and automated lines which do not need the supply of materials for about a half day if there are some stock of materials such as material processing lines. In the assembly line such as the former one, workers take part in the manufacturing, and therefore the operation not much more than 8 hours is conducted in a day, and besides a lunch time zone, break time zone and so forth are set during the operation time. In the automated line such as the latter one, 24-hour operation is performed in many situations for increasing the operating ratio of facilities.

If such a state is observed from a viewpoint of performing the simulation, it is required to set the value of the simulation time width $\Delta t$ to not much more than 2 or 3 minutes of tact time in the assembly line. However, in the automated line, the value of the time width $\Delta t$ can be a much longer time width, for example 2 or 3 hours, and in some situations a half day long may be acceptable without causing problems.

If the simulation is carried out in such a manufacturing plant over a day or a week, even in the assembly lines, execution of simulation of the short time width $\Delta t$ during the lunch time or the break time results in the waste of time. For example, if it is assumed that the time width $\Delta t$ is set to 2 minutes and the lunch time is 45 minutes long, data communication between the supervisor and each simulator occurs 22 times though the assembly line is not operated during the lunch time. The time required by the communication includes the time required for an analyzing process of the communication data and for generation of the communication frame as well as the time necessary for the communication itself, which cannot be ignored.

After the closing hour of the factory, operation of the assembly lines is finished and only the automated lines are operated. If the time width $\Delta t$ is set to 2 minutes, an enormous number of times of communications and analyzing processes of communication data occur between the supervisor and each simulator by the starting hour of the assembly lines in the next morning (If it is assumed that the starting hour is 8:00 and the closing hour is 17:00, 450 times of communications and analyzing processes of communication data occur). Since only the automated lines are operated in this time zone, the value of the time width $\Delta t$ of 2 or 4 hours may be satisfactory. For example, in the case where the value of the time width $\Delta t$ of 2 hours is acceptable, the number of times of occurrence of communications between the supervisor and each simulator is approximately 8, and therefore 442 times of communications in the above case of 2-minute time width $\Delta t$ are wasteful. Besides, if only the automated lines are operated during weekends or holidays while the assembly lines are stopped, more enormous number of wasteful communications may occur.

As described so far, wasteful communications occur between the supervisor and simulators in the conventional technique, thereby the process speed in performing the simulation is reduced.

SUMMARY OF THE INVENTION

The present invention has been made in view of the above circumstances and has an object to provide a distributed simulation apparatus and a method using thereof which overcome the above-described problems by performing simulation of the time width suitable to the circumstances in the manufacturing process employing variable time width $\Delta t$ of the simulation which is performed repeatedly.

The present invention, in particular, has an object to provide a synchronous distributed simulation apparatus and method for performing simulation with changing the simulation time width $\Delta t$ when the state of operation in the manufacturing process is changed such as the starting hour, break time, closing hour, or the like.

It is noted that Japanese Patent Application Laid-Open No. Hei. 3-261320 (1991) discloses an invention in which a value of a timer is advanced in the case where it is confirmed by simulation that there is no trouble, and the time width of the next simulation is increased by the advanced value of the timer, and accordingly the number of times of repeating the simulation is reduced.

However, in the invention, only the time width of simulation is automatically increased by a predetermined time on condition that there is no trouble, and the invention cannot realize the simulation in various circumstances in the manufacturing process, which is intended to be realized by the present invention.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims. To achieve the objects and in accordance with the purpose of the invention, as embodied and broadly described herein, a synchronous distributed simulation apparatus of the present invention has a simulation supervising device which supervises a simulation device, and the simulation device which performs a simulation under supervision of the simulation supervising device, in which the simulation supervising device comprises counting means for counting time in simulation, time width setting means for setting a time width of simulation for each time zone where facilities are operated in a manufacturing process which is an object of the simulation in accordance with the time counted by the counting means, and transmitting means for transmitting data showing the time width set by the time width setting means to the simulation device, and the simulation device comprises receiving means for receiving the data showing the time width transmitted by the transmitting means in the simulation supervising device, discrete-event simulation means for simulating the manufacturing process in which change of a state may be modeled to discretely occur, and controlling means for performing simulation by the discrete-event simulation means with the time width of simulation according to the data showing the time width received by the receiving means.

BRIEF DESCRIPTION OF THE DRAWINGS

The accompanying drawings, which are incorporated in and constitute a part of this specification illustrate embodiment of the invention and, together with the description, serve to explain the objects, advantages and principles of the invention. In the drawings:

FIG. 4 shows a list of SIM messages in the embodiment:

DETAILED DESCRIPTION OF THE PREFERRED EMBODIMENT

Preferred embodiment of a synchronous distributed simulation apparatus according to the present invention is now described in detail based on the drawings.

First Embodiment

Figure 1:
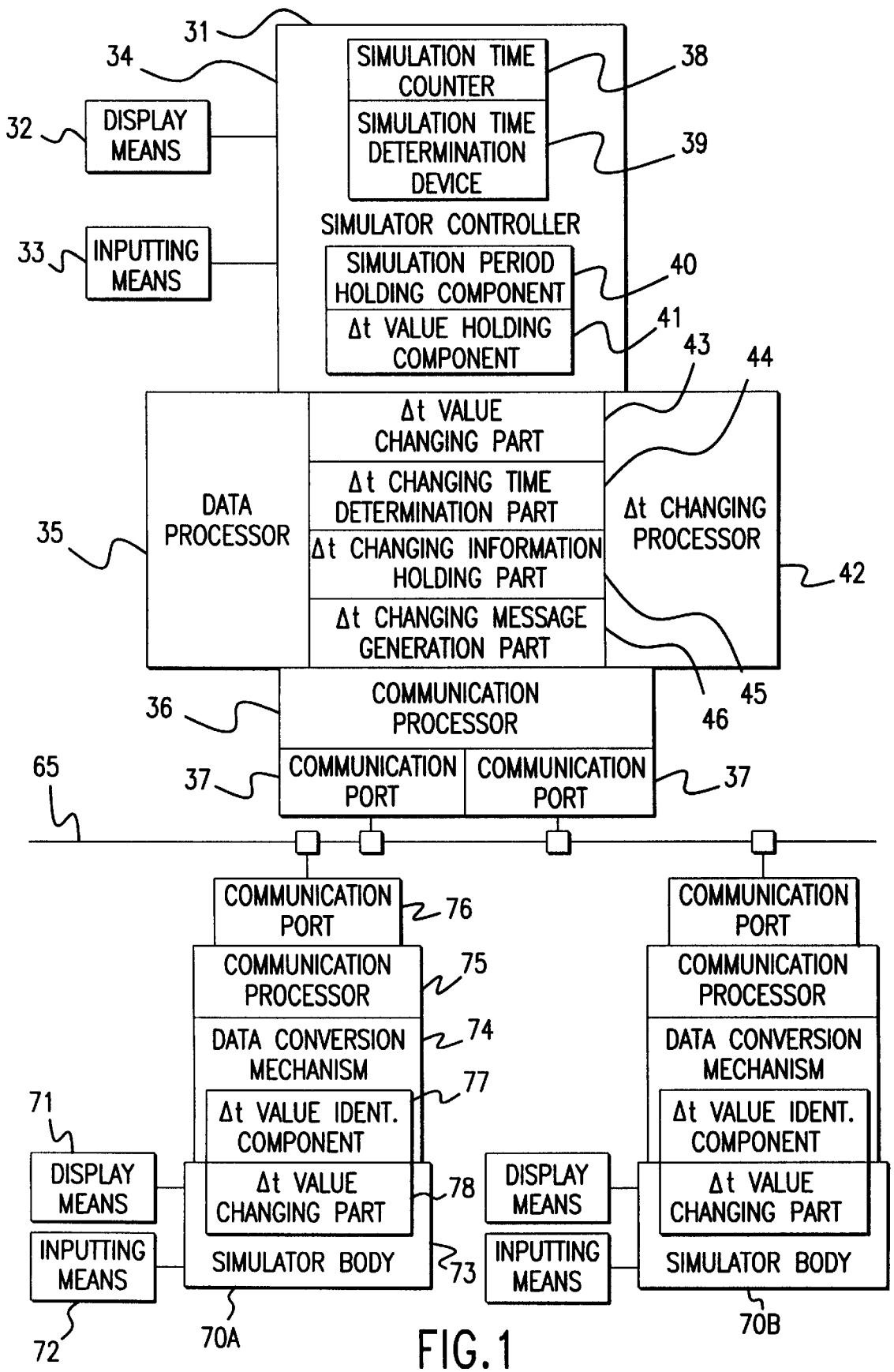
FIG. 1 shows the construction of an embodiment of a distributed simulation apparatus according to the present invention.

FIG. 1 shows the construction of an embodiment of the synchronous distributed simulation apparatus. In this embodiment, a supervisor (a simulation supervising device) 31 and two simulators (simulation devices) 70A and 70B are connected to a network (eathernet) 65. Each of the simulators 70A and 70B is a model of a factory manufacturing 3 types of copying machine: one is an assembly simulator which is a model of a manufacturing planning and three assembly lines containing two sub assembly lines for assembling a sorter, another is an automated machine simulator which is a model of lines storing parts or finished products in a automated warehouse, transporting the parts or finished products by an autoguided vehicle (in FIG. 2, and hereinafter referred to as AGV), and mechanically processing frames or sheet metals in a machining center.

Figure 2:
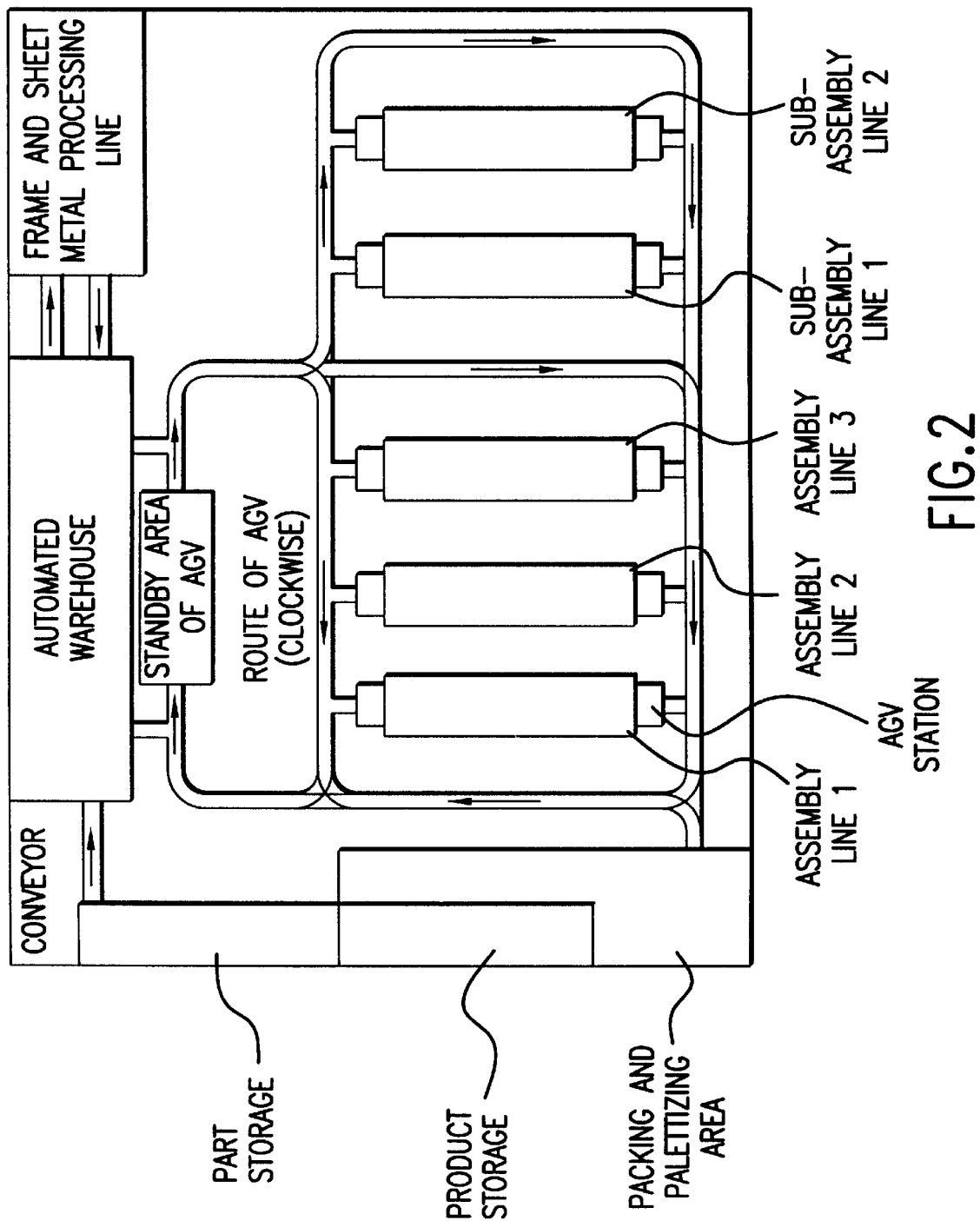
FIG. 2 typically shows the layout in a factory which is an object of the embodiment.

First, the factory, an object of simulation by the embodiment is described. An actual layout of the factory is as shown in FIG. 2, where three lines are operated from 8:00 a.m. to 5:00 p.m., and a period from 0:00 p.m. to 0:45 p.m. is a lunch time. The automated warehouse, AGVs, and the machining center provided to the frame and sheet metal processing line are of 24-hour operation and are not stopped throughout the year except for the time of seasonal maintenance. All AGVs move clockwise as shown by arrows in the figure to carry chassis, sorters and finished products in accordance with the command from the manufacturing plan and each of the lines. Small parts such as wire harnesses, tie laps and screws are supplied to each line by conveyors, which are not shown in FIG. 2 for avoiding complexity.

The parts such as wire harnesses, trays and panels are delivered in a lump in the afternoon, and transported to the automated warehouse by the conveyor. The parts transported to the warehouse are to be assembled in the next day; therefore divided into groups having different destinations in accordance with the next day's manufacturing plan and then stored in the warehouse. The materials for processing stored in the warehouse, for example, frames are supplied to the processing line by the conveyor before the materials are out of stock, and finished materials are carried to the automated warehouse by another conveyor to be stored.

In this simulation model, check is made on whether the amounts of parts, materials or products to be carried or stored are not beyond the capacity of the AGV or automated warehouse at the time of maximum manufacturing, how many AGVs should be prepared and under what rule (such as the priority order at the intersection) they should be moved, and so forth. At this time, according to the synchronous distributed simulation method of the present invention, each individual simulation model is made independently before the synchronous distributed simulation is performed, and after the complete modeling, the process proceeds to the whole simulation; consequently, the model can be prepared more effectively than preparing a single large-scale model.

In FIG. 1, a supervisor 31 has display means 32, a simulation controller 34, a data processor 35, a communication processor 36, communication ports 37, which are the same as those of the conventional technique, and in addition, a Δt changing processor 42. The Δt changing processor 42 has a Δt value changing part 43, a Δt changing time determination part 44, a Δt changing information holding part 45 and a Δt changing message generation part 46. The Δt value changing part 43 changes the Δt value held in the Δt value holding component 10 of the simulation controller 34. The Δt changing time determination part 44 determines the time when the Δt value is changed. The Δt changing information holding part 45 holds the matrix of Δt values corresponding to the Δt changing time. The Δt changing message generation part 46 generates the data transmitted to the simulators 70A and 70B for changing the simulation time width Δt.

The simulation controller 34 comprises a simulation time counter 38 counts the time in the simulation, a simulation time determination device 39 for determining the time when the simulation is started, a simulation period holding component 40 for holding information about the predetermined period of the simulation, and a Δt value holding component 41 for holding the value of the simulation time width Δt which is directed to the simulators 70A and 70B.

Communication by a socket using a communication protocol TCP/IP widely utilized in a BSD system of UNIX is executed between the supervisor 31 and each of the simulators 70A and 70B. The communication ports 37 to the number of the connected simulators 70A and 70B are provided to the supervisor 31. Port numbers, for example, 4001 and 4002 are assigned to the ports 37, and in the client side, the port numbers 5001 and 5002 are assigned to the ports of the simulators 70A and 70B, respectively. The port of the supervisor 31 and the port of the client side both having the same numeric value in the units digit of the port number are set to communicate with each other. The socket on the supervisor 31 is a server process which can reply to the request of connection from each of the simulators 70A and 70B which are the client processes.

Each of the simulators 70A and 70B on the side of client is equipped with display means 71, inputting means 72, a simulator body 73, a data conversion mechanism 74, a communication processor 75, and a communication port 76 which are same as those of the conventional apparatus, and further equipped with a Δt value identifying component 77 for fetching a new Δt value from the Δt changing message which changes the simulation time width if it is transmitted from the supervisor 31 and a Δt value changing part 78 for setting the fetched Δt value as the simulation time width Δt in the simulation model described in the simulator body 73, between the data conversion mechanism 74 and the simulator body 73.

Figure 9:
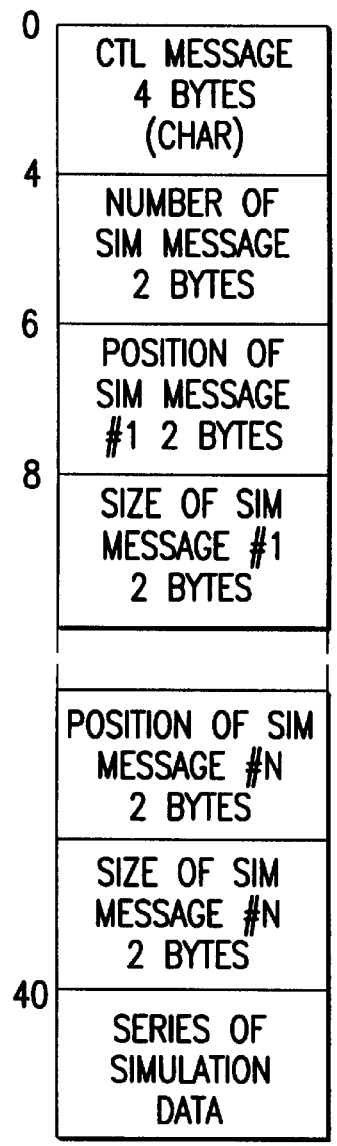
FIG. 9 is a conceptional view showing a format of data communicated through a network in the distributed simulation apparatus according to the present invention.
Figure 10:
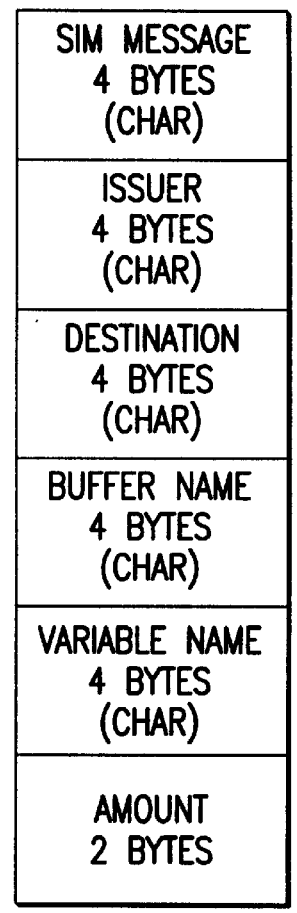
FIG. 10 is a conceptional view showing a format of simulation data in the data communicated through the network in the distributed simulation apparatus according to the present invention.

The data transmitted/received between the communication ports 37 of the supervisor 31 and the communication ports 76 of the simulators 70A and 70B are the same as those of the conventional technique described with reference to FIGS. 9 and 10. The data transmitted from the supervisor 31 to each of the simulators 70A and 70B is converted into the a format as shown in FIG. 9 by the data processor 35. The data is treated as a frame of 1024 bytes for executing communication through the socket, and portion having no data is filled with null code 00h.

Figures 3, 5:
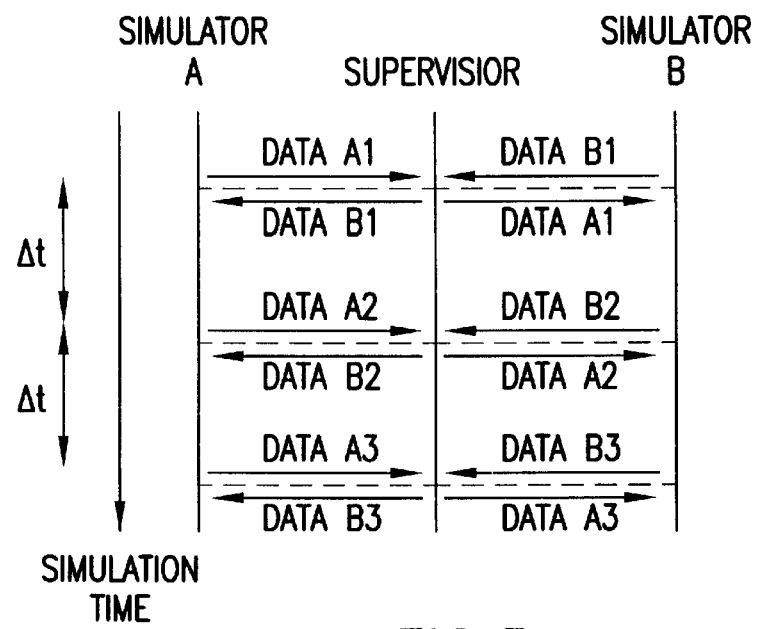
FIG. 3 shows a relation between the time of changing of the simulation time width and the value of the simulation time width in the embodiment.
FIG. 5 is a time chart showing process procedures in centralized supervising synchronous type simulation.
Figure 6:
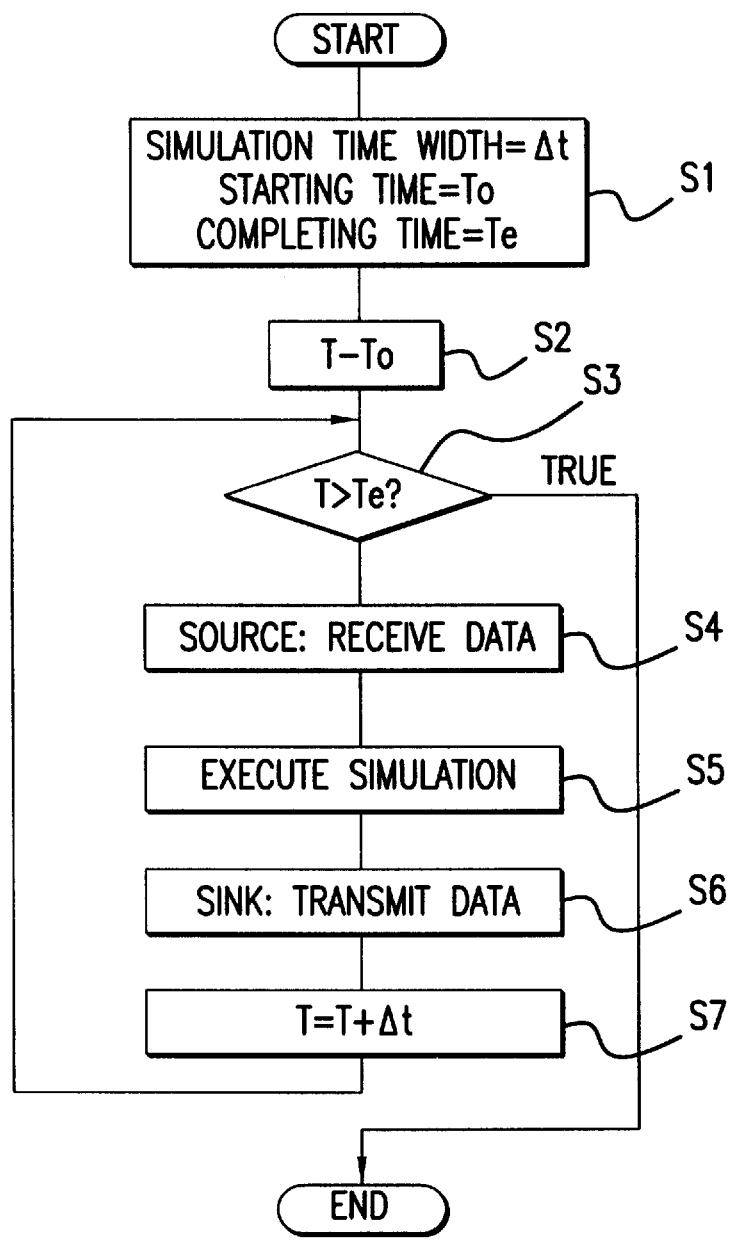
FIG. 6 is a flow chart showing process procedures of a simulator in conventional technique.
Figure 7:
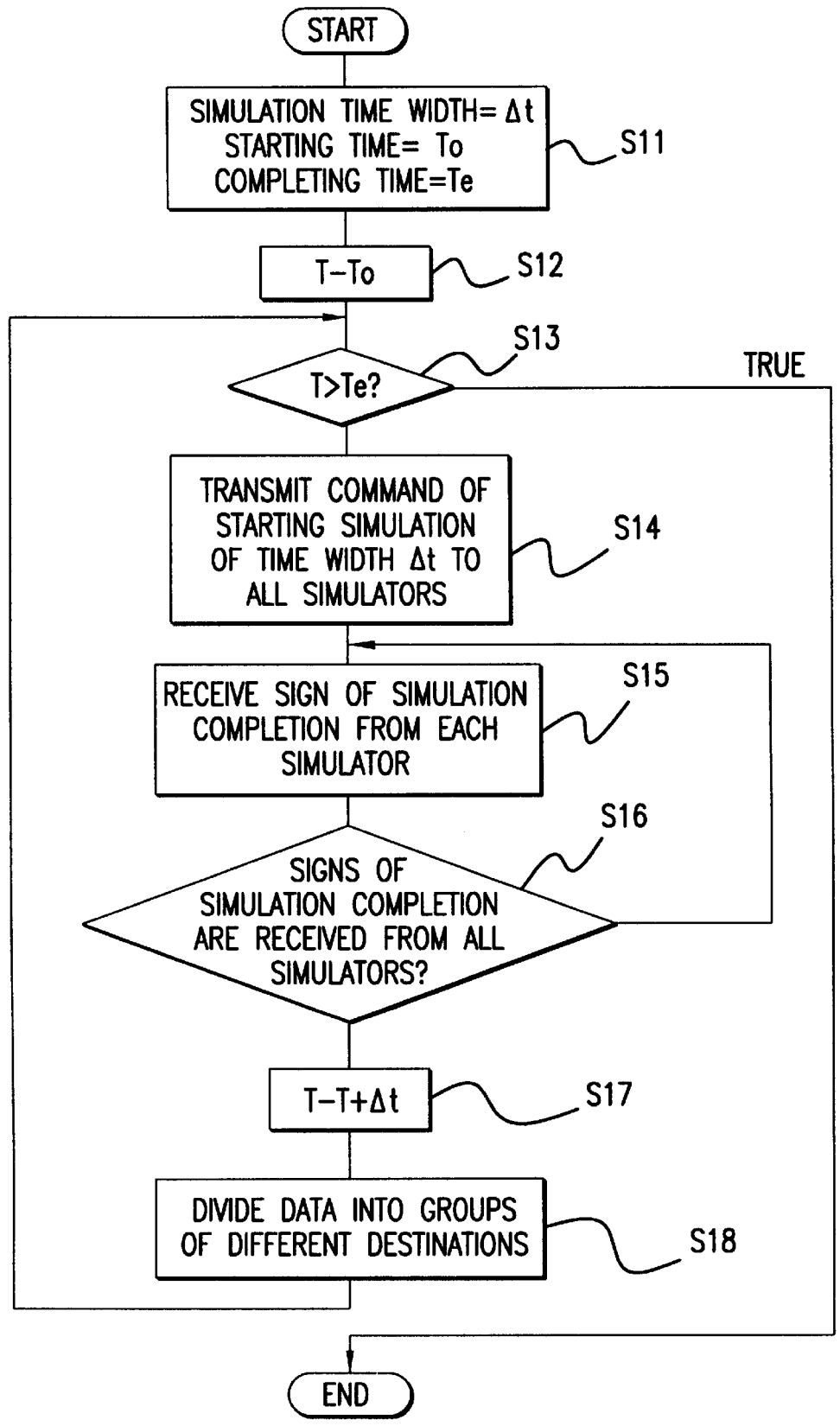
FIG. 7 is a flow chart showing process procedures of a supervisor in conventional technique.
Figure 8:
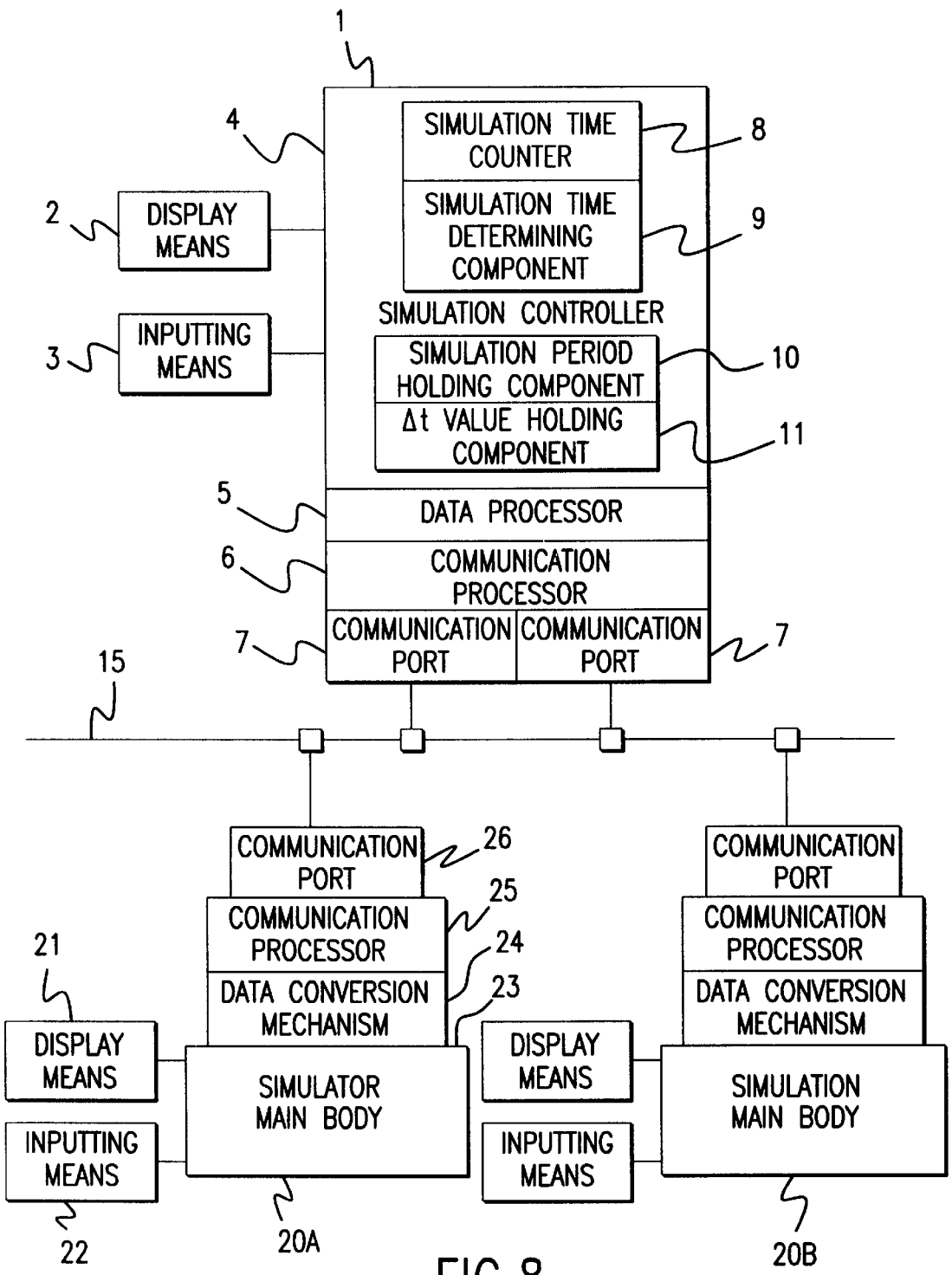
FIG. 8 shows the construction of a distributed simulation apparatus according to conventional technique.

The supervisor 31 holds a simulation time count variable ST and a Δt setting variable DT in the simulation time counter 38 and the Δt holding component 41, respectively. The supervisor 31 proceeds with the simulation according to the procedures as shown in FIG. 5, and executes a process of adding ST=ST+DT on every advance of the simulation to update the simulation time. The whole simulation is completed at the time when the value of the simulation time count variable ST reaches the value set at the simulation period holding component 40.

Before the above-described process is carried out in the data processor 35, the supervisor 31 reorganizes the simulation controlling command and the simulation data communicated between the supervisor 31 and the simulators 70A and 70B (namely, an input/output request from each simulator) in the simulation controller 34 for making groups having different destinations. This operation is carried out by dividing the simulation data per destination of request in accordance with the data of destination of request contained in the simulation data.

Other than the above operation, before starting the simulation, the simulation controller 34 notifies information about the simulation time interval and the simulation period to each of the simulators 70A and 70B and executes the synchronous control of the distributed simulation. That is, when the preparation of data transmission to all simulators is completed, the simulation controller 34 transmits those data to each simulator through the communication port 37, then sets the communication ports 37 to the state of listen, and waits for arrival of the information about completion of the simulation of the time width Δt from each simulator. At that time, the simulation controller 34 calls the Δt changing component 42 before performing each synchronous controlling process to make the Δt changing time determination component 44 check whether the present simulation time is the time for changing the value of Δt or not. If it is necessary to change, the Δt value in the Δt value holding component 41 is changed to a new value in accordance with the information held in the Δt changing information holding component45.

The Δt changing time determination component 44 determines whether it is the time for changing the simulation time width Δt by comparing the next Δt changing time indicated by the Δt changing information holding component 45 with the value of the simulation time counter 38. The Δt changing information holding component 45 holds pairs of simulation data in the time descending order as shown in FIG. 3: one of the data is the time for changing the simulation time width Δt (simulation time), and another is the Δt value to be changed. These times for changing the simulation time width Δt and Δt values to be changed are predetermined according to the state of operation of the manufacturing process. These times and Δt values are written in the memory of the Δt changing information holding component 45 by the inputting means 33, which are converted from the ASCII format into the unsigned binary when they are written.

In this embodiment, the simulation starting time is 8:00 a.m. The simulation times shown in FIG. 3 are described in units of minutes regarding the simulation starting time as a starting point, and the values of the time width Δt to be changed are also described in the units of minutes.

That is, according to the Δt changing information shown in FIG. 3, from the starting time of 8:00 a.m. to 0:00 p.m., 240 minutes later from 8:00 a.m., the time width Δt is set to 5 minutes as initialized, but in the lunch time zone of 45 minutes, namely from 0:00 p.m. to 0:45 p.m. which is 285 minutes later from 8:00 p.m., the time width Δt is changed to 45 minutes so that a single cycle of simulation may cover the lunch time zone. After 0:45 p.m., namely 285 minutes later from 8:00 a.m., the time width Δt is changed to 5 minutes again, and thereby the simulation of the small time width is performed. In the break time zone of 30 minutes after closing hour, beginning at the time 480 minutes later from 8:00 a.m., the time width Δt is changed to 30 minutes so that the simulation of a single cycle may be completed. During the night operation time zone subsequent to the break time zone, namely, from the time 1410 minutes later from 8:00 a.m. to 7:30 a.m. in the next morning, the time width Δt is changed to 180 minutes so that the simulation may be effectively performed with relatively long time width. After 7:30 a.m., the time width Δt is changed to 30 minutes to ready for 8:00 a.m. operation starting time.

Here, the reason of the setting the simulation time width Δt during the day operation time to 5 minutes in this embodiment is that the tact time of the line is 2 minutes, and that buffers for delivery of the articles are secured on the line, because the buffer generates a margin time of (tact time) * (the number of buffers) when the parts or finished products are supplied, and therefore the time width Δt can exceed the tact time without causing delay in the supply of the parts or the process on the line as long as it is confined within the range of the margin time. In this embodiment, at least 3 buffers are secured, and accordingly, the time width Δt can be set to 6 minutes. However, in this case, the time width Δt is set to 5 minutes taking convenience of calculating in proceeding with simulation into consideration. In the processing lines of nighttime operation, the time width Δt is set in a similar way of the above consideration.

Practically, the number of buffers secured on the line is not much exceeding 10; therefore it is desirable to set the simulation time width Δt not more than 10 times as long as the tact time.

In the Δt changing information shown in FIG. 3, the first (left) row of the matrix indicates the value of the simulation time and the second (right) row indicates the value of the time width Δt, and each value is referred to by operation of the pointer.

The Δt changing processor 42 updates the simulation time width Δt by executing the following processes in accordance with the Δt changing information. The Δt changing processor 42 has an index pointer, which indicates the last column of the matrix at first, for referring to the matrix in the Δt changing information holding component 45, and the value indicated by the index pointer is set when the simulation is started. The value to be set is that obtained by subtracting 1 from the number of times of changing the value of the time width Δt, and in the example shown in FIG. 3, the value is 9. Since the value of the index pointer is decremented every time the value of Δt is changed, it is always possible to refer to the next Δt changing time (simulation time) and the value of Δt. If the value of the index pointer is negative, the change of the Δt value is already unnecessary; therefore, in the case where the value of the index pointer is negative, the determination of Δt changing time is not carried out. The value of Δt to be set initially is predetermined as Δt=5 in the Δt value holding component 41 in the simulation controller 34.

Under the above operations, the present simulation time T counted by the simulation time counter 38 is compared with the time t which is held in the Δt changing information holding component 45 and indicated by the index pointer. If T<t, nothing is executed the process, and if T≧t, a changed Δt value described in the second (right) row of the matrix is fetched and set in the Δt value holding component 41 of the simulation controller 34 by the Δt changing component 43.

Next, the Δt changing processor 42 calls the Δt changing message generator 46 and generates data for issuing "CHDT". The data is received by the communication processor 36 and then transmitted to each of the simulators 70A and 70B. After transmitting "CHDT", the Δt changing processor 42 waits for "ENCH" returned from each simulator, and when the Δt changing processor 42 confirm that "ENCH"'s are received from all simulators, the controlling process is returned to the simulation controller 34. That is, at the time of changing the value of Δt in the simulation controller 34, the Δt changing processor 42 not only performs the change of value of Δt but also executes a series of operations from the issue of "CHDT" to the receipt of "ENCH" with interruption in the normal simulation process. Consequently, it is satisfactory that the simulation controller 34 only repeats the cycle as shown in FIG. 5 when the controlling process is returned by the Δt changing processor 42 as same as before without changing any data having been received earlier.

In the simulation model on each of the simulators 70A and 70B, a communication event which executes the communication between the supervisor 31 and each simulator is described. If the event is generated, the data conversion mechanism 74 is called. In the case of receiving data from the supervisor 31, the data received by the socket is converted into the data format used in the simulator, and the process is carried out based on the simulation controlling command described therein, and also the process of setting the data necessary for simulation to the relevant simulation variable is executed. At this time, if the received simulation controlling command is "CHDT", the Δt value identification component 77 is called and fetches a new value of the time width Δt which has been transmitted accompanying with "CHDT". The fetched Δt value is transmitted to the Δt value changing component 78 for updating the value of the simulation time width Δt of the simulator body 73. Then the Δt value changing component 78 does not transfer the controlling process to the simulator body 73, but generates a frame of "ENCH" message corresponding to the command "CHDT" and transmits the data to the communication processor 75, and thereby a phase of the simulation controlling command "CHDT" is completed.

In the 2 days example shown in FIG. 3, by executing the above-described processes, it is possible to perform the simulation of the 5-minute time width Δt during the periods from 8:00 a.m. to 0:00 p.m. and from 0:45 p.m. to 4:00 p.m., and perform the simulation of the 180-minute time width Δt during the period from 5:30 p.m. to 7:30 a.m. in the next morning. In the 45 minutes of lunch time zone and 30 minutes of break time zone after the closing hour, the time widths Δt are set to 45 minutes and 30 minutes, respectively, and therefore simulation can be achieved by a single synchronization command in each period.

The processes as described above are executed from the start of the simulation to the end of the simulation, wherein the simulation data communicated in the meantime are provided by the SIM messages as shown in FIG. 4. The following is an example of the communication.

With the start of the simulation, the manufacturing line is informed of a manufacturing amount per day by a manufacture directing SIM message. The SIM message providing a manufacturing direction to manufacture 500 small copying machines (smal) by the assembly line 1 shown in FIG. 2 and 250 multi-functional copying machines (mult) by each of the assembly lines 2 and 3 shown in FIG. 2 per day is represented as follows:

"PRODSUPVMANG00013, smal, 250, mula, 250, mulb, 250". Subsequent to the SIM message "PROD", "SUPV" indicating the issuer and "MANG" indicating the destination follow. The next numeral "0001" is a job number which specifies the processing and the numeral "3" subsequent thereto indicates that the manufacture directing message provides the manufacturing command for 3 articles. "0" in thousand digits of the job number indicates that the message is issued by the supervisor "SUPV", and in the same way, the numbers of thousand digits "1", "2" and "3" indicates that the messages are issued by the processing line "PROC", the assembly line "MANG", and the transportation line "TRAN", respectively. If the job number counts to "999", then starts to count from "000" again. As the first 4 characters of the argument of the SIM message, the job number is always assigned. Subsequent to the comma (,), the article to be manufactured and the amount to be manufactured are repeatedly described while they are distinguished from each other by commas.

At the first time, the SIM message is transmitted to the assembly line simulator with SIMS which is a simulation starting command of the CTL message. On receiving the message, the assembly line simulator examines whether there are materials and parts necessary for manufacturing, and makes a request of parts delivery to the transportation line simulator in the case where the parts are insufficient. Now assuming that there is a shortage of 3 power supply units "pwsl" and 4 paper feeders "ppfd", and "pwsl"s and "ppfd"s should be delivered to station numbers 4 and 7, respectively, the following two SIM messages are generated:

"TRIQMANGTRAN20011, 4, pwsl, 3" and
"TRIQMANGTRAN20021, 7, ppfd, 4", and if it is assumed that a request for transportation of 2 finished products "mula" together from the assembly line to the automated warehouse, the following SIM message is generated:

"TROQMANGTRAN20031, mula, 2".

These messages are once transmitted to the supervisor with "SIMR" which is the Δt completion command of the first simulation, and then divided into groups having different destinations in the supervisor. After that these SIM messages are transmitted to each destination simulator with "DTST" which is the Δt starting command next to "SIMS".

On receiving the above three SIM messages, if there is an AGV immediately available, the transportation line simulator picks out the requested articles from the automated warehouse and loads the AGV with the articles for forwarding them. The AGV spends the time required in moving its route, and then arrives at the specified station. As the AVG arrives at the station, the delivery completion command "TROE" is transmitted accompanying with the Δt completion command after arrival to the simulator which has issued the SIM messages. Assuming that delivery in reply to the delivery request from the station 4 is now completed, the SIM message is described as follows:

"TROETRANMANG20014".

As stated before, "TROE" described the issuer of the SIM message and the destination, and "2001" subsequent thereto is the job number corresponding to the delivery request, whereby it is possible to identify for which request the delivery completion is indicated. "4" located in the last position provides the station number. Based on the information, the assembly line simulator determines which process is executed, and changes the simulation variable in accordance with the determination. In this example, a process that 7 "ppfd" symbols are set in the matrix of variables indicating the buffer of station 4 is executed. With the above mechanism, there occurs no problem even if the plural requests are made by the same station and the order of replies are inverted by the different routes or the like. In a similar way, replies to the requests having job numbers 2002 and 2003 are executed.

In the current embodiment, the simulation in units of time width Δt is repeated while the time width Δt is changed in accordance with the state of the manufacturing process until the simulation time reaches the predetermined simulation completion time. Consequently, speedy simulation can be performed by removing wasteful data communication between the supervisor and the simulators.

The foregoing description of preferred embodiment of this invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A synchronous distributed simulation apparatus having a simulation supervising device which supervises a simulation device, the simulation device performing a simulation under supervision of the simulation supervising device, the simulation supervising device comprising:

counting means for counting time in the simulation;

a memory that stores a plurality of predetermined time zones and a plurality of predetermined time widths, each of the plurality of predetermined time zones having a corresponding one of the predetermined time widths, wherein the correspondence between each of the predetermined time zones and their corresponding time width is not changed during the simulation;

time width setting means for selecting as a current time zone one of the plurality of predetermined time zones based on the time counted by the counting means and for setting a simulation time width to one of the predetermined time widths corresponding to the current time zone; and transmitting means for transmitting the simulation time width set by the time width setting means to the simulation device, wherein the simulation device comprises:

receiving means for receiving the simulation time width;

discrete-event simulation means for simulating an event in which a change of a state is modeled to discretely occur; and controlling means for controlling the discrete-event simulation means based on the simulation time width received by the receiving means.

2. The synchronous distributed simulation apparatus according to claim 1, wherein the memory includes memory means for storing at least one time zone of the plurality of time zones and a time width corresponding to the at least one time zone.

3. The synchronous distributed simulation apparatus according to claim 1, wherein the simulation supervising device further comprises:

second transmitting means for transmitting information necessary for the simulation, and the simulation device further comprises:

second receiving means for receiving the information transmitted by the second transmitting means in the simulation supervising device, and wherein the discrete-event simulation means performs a simulation in accordance with the information received by the second receiving means.

4. The synchronous distributed simulation apparatus according to claim 2, wherein the simulation supervising device further comprises:

second transmitting means for transmitting information necessary for the simulation, and the simulation device further comprises:

second receiving means for receiving the information transmitted by the second transmitting means, and wherein the discrete-event simulation means performs a simulation in accordance with the information received by the second receiving means.

5. The synchronous distributed simulation apparatus according to claim 1, wherein the plurality of predetermined time zones include:

a first time zone from a starting time to a break starting time, a second time zone from the break starting time to a break ending time, a third time zone from the break ending time to a closing time, wherein a time width corresponding to the second time zone is longer than a time width corresponding to the first time zone.

6. The synchronous distributed simulation apparatus according to claim 2, wherein a time width of the plurality of predetermined time widths in the memory is not more than ten times as long as a tact time assigned to a single process in a time zone to which the time width corresponds.

7. The synchronous distributed simulation apparatus according to claim 1, wherein the simulation device further comprises:

second transmitting means for transmitting information as a result of the simulation by the discrete-event simulation means, and the simulation supervising device further comprises:

second receiving means for receiving the information transmitted by the second transmitting means;

data generating means for generating data required by the discrete-event simulation means at a time when the next simulation is to be performed in accordance with the information received by the second receiving means; and third transmitting means for transmitting the data generated by the data generating means, and the simulation device further comprises:

third receiving means for receiving the data transmitted by the third transmitting means, and wherein the discrete-event simulation means in the simulation device performs a simulation in accordance with the data received by the third receiving means.

8. A synchronous distributed simulation method comprising the steps of:

counting a time in a simulation;

selecting a current time zone from a plurality of predetermined time zones based on the time in the simulation counted in the counting step, wherein each of the plurality of predetermined time zones have a corresponding predetermined time width and wherein the correspondence between each of the predetermined time zones and their corresponding time width is not changed during the simulation;

setting a simulation time width to the time width corresponding to the current time zone;

transmitting the simulation time width to a simulation device;

receiving the transmitted time width at the simulation device; and performing a simulation with the simulation device based on the received simulation time width.

9. The synchronous distributed simulation method according to claim 8, further comprising:

transmitting information necessary for the simulation to the simulation device; and receiving the transmitted information at the simulation device, wherein the simulation device performs a simulation in accordance with the information received by the second receiving means.

10. The synchronous distributed simulation method according to claim 8, wherein the plurality of predetermined time zones include:

a first time zone from a starting time to a break starting time;

a second time zone from the break starting time to a break ending time; and a third time zone from the break ending time to a closing time, wherein a time width corresponding to the second time zone is longer than a time width corresponding to the first time zone.

11. The synchronous distributed simulation method according to claim 10, wherein each of the predetermined time widths are not more than ten times as long as a tact time assigned to a single process in a time zone to which the information corresponds.

12. The synchronous distributed simulation method according to claim 8, further comprising:

transmitting information from the simulation device as a result of the simulation by the simulation device;

receiving the transmitted information;

generating information required by the simulation device at a time when the next simulation is to be performed in accordance with the information received;

transmitting the generated information; and receiving the generated information transmitted at the simulation device, wherein the simulation device performs a simulation in accordance with the information received.

13. A synchronous distributed simulation apparatus having a simulation supervising processor which supervises a simulation processor, the simulation processor performing a simulation under supervision of the simulation supervising processor, the simulation supervising processor comprising:

a counter that counts time in the simulation;

a memory that stores a plurality of predetermined time zones and a plurality of predetermined time widths, each of the plurality of predetermined time zones having a corresponding one of the predetermined time widths, wherein the correspondence between each of the predetermined time zones and their corresponding time width is not changed during the simulation;

a time width processor that selects a current time zone from the plurality of predetermined time zones based on the time counted by the counter and sets a simulation time width to one of the predetermined time widths corresponding to the current time zone; and a first communication processor that transmits the simulation time width to the simulation processor, wherein the simulation processor comprises:

a second communication processor that receives the simulation time width transmitted by the simulation supervising processor;

a discrete-event simulation processor that simulates an event in which a change of a state is modeled to discretely occur; and a simulator body that controls the discrete-event simulation processor based on the simulation time width received by the second communication processor.

14. The synchronous distributed simulation apparatus according to claim 13, wherein the first communication processor of the simulation supervising processor transmits information necessary for the simulation and the second communication processor of the simulation processor receives the information transmitted by the first communication processor, and wherein the discrete-event simulation processor performs a simulation in accordance with the information received by the second communication processor.

15. The synchronous distributed simulation apparatus according to claim 13, wherein the plurality of time zones stored in the memory include:

a time zone from a starting time to a break starting time;

a time zone from the break starting time to a break ending time;

a time zone from the break ending time to a closing time wherein a time width corresponding to the time zone from the break starting time to the break ending time is longer than a time width corresponding to the time zone from the starting time to the break starting time.

16. The synchronous distributed simulation apparatus according to claim 15, wherein each of the plurality of predetermined time widths are not more than ten times as long as a tact time assigned to a single process in a time zone to which the information corresponds.

17. The synchronous distributed simulation apparatus according to claim 13, wherein the second communication processor of the simulation processor transmits information as a result of the simulation by the discrete-event simulation processor and the first communication processor of the simulation supervising processor receives the information transmitted by the second communication processor, and wherein the simulation supervising processor further comprises:

a data conversion mechanism that generates data required by the discrete-event simulation processor at a time when the next simulation is to be performed in accordance with the information received by the first communication processor, the data generated being transmitted by the first communication processor, and wherein the second communication processor of the simulation processor receives the data transmitted by the first communication processor and the discrete-event simulation processor performs a simulation in accordance with the data received by the second communication processor.

* * * * *